United States Patent [19]

Mueller

[11] Patent Number: 4,571,015
[45] Date of Patent: Feb. 18, 1986

[54] ELECTRICAL CONNECTOR HAVING ROTATING CLAMPS FOR SECURING ELECTRONIC PACKAGES THEREIN

[75] Inventor: Arthur L. Mueller, Camp Hill, Pa.

[73] Assignee: AMP Incorporated, Harrisburg, Pa.

[21] Appl. No.: 717,592

[22] Filed: Mar. 29, 1985

Related U.S. Application Data

[63] Continuation of Ser. No. 590,241, Mar. 16, 1984, abandoned.

[51] Int. Cl.⁴ .......................................... H01R 23/72
[52] U.S. Cl. .......................... 339/17 CF; 339/75 MP
[58] Field of Search .......... 339/17 CF, 75 M, 75 MP, 339/174, 176 MP

[56] References Cited

U.S. PATENT DOCUMENTS

| | | | |
|---|---|---|---|
| 3,757,271 | 9/1973 | Judge et al. | 339/17 CF |
| 3,960,423 | 6/1976 | Weisenburger | 339/17 CF |
| 4,220,383 | 9/1980 | Scheingold et al. | 339/17 CF |
| 4,427,249 | 1/1984 | Bright et al. | 339/17 CF |

OTHER PUBLICATIONS

IBM Bulletin, Byrnes, vol. 13, No. 7, p. 2074, 12-1970.

*Primary Examiner*—Neil Abrams
*Attorney, Agent, or Firm*—Allan B. Osborne

[57] ABSTRACT

The invention discloses an electrical connector for interconnecting electronic packages to printed circuit boards. The connector includes clamps which, in cooperation with the circuit board, secure the connector thereto and place the interconnecting members in compression between the package and board.

14 Claims, 8 Drawing Figures

ELECTRICAL CONNECTOR HAVING ROTATING CLAMPS FOR SECURING ELECTRONIC PACKAGES THEREIN

This application is a continuation of application Ser. No. 590,241 filed Mar. 16, 1984, now abandoned.

U.S. Pat. No. 3,960,423 discloses an electrical connector for interconnecting conductive pads on a leadless chip carrier or substrate to conductive pads on a printed circuit board. The connector employs a thin polymeric film with flat conductors on one side as the conduit. A supporting frame carries the film which has been shaped to provide contact surfaces on the flat conductors to engage the pads. The supporting frame is positioned within a confining frame which is mounted on the circuit board with bolts in the board extending up through holes in the confining frame. After a substrate is placed in the supporting frame, a hold-down frame with corner holes is placed on top of the two frames substrate subassembly with the aforementioned bolts passing through the holes. Nuts threaded onto the bolts secure the entire assembly to the board and also provide a biasing force between the contact surfaces and pads.

A connector, as generally defined in the first paragraph of this specification, according to the present invention is characterized in comprising a housing with receiving means for receiving an electronic package and having conductive means to provide electrical paths between the package and circuits on a printed circuit board and elongated clamps rotatably mounted in the housing with one end extending through the board and having means thereon to bear against the underside and a bearing section adjacent the other end adapted for being rotated over and against the package which may be in the opening so that the conductive means are placed in compression between the package and board.

For a better understanding of the invention, reference will now be made by way of example to the accompanying drawings, in which.

Figure 1:
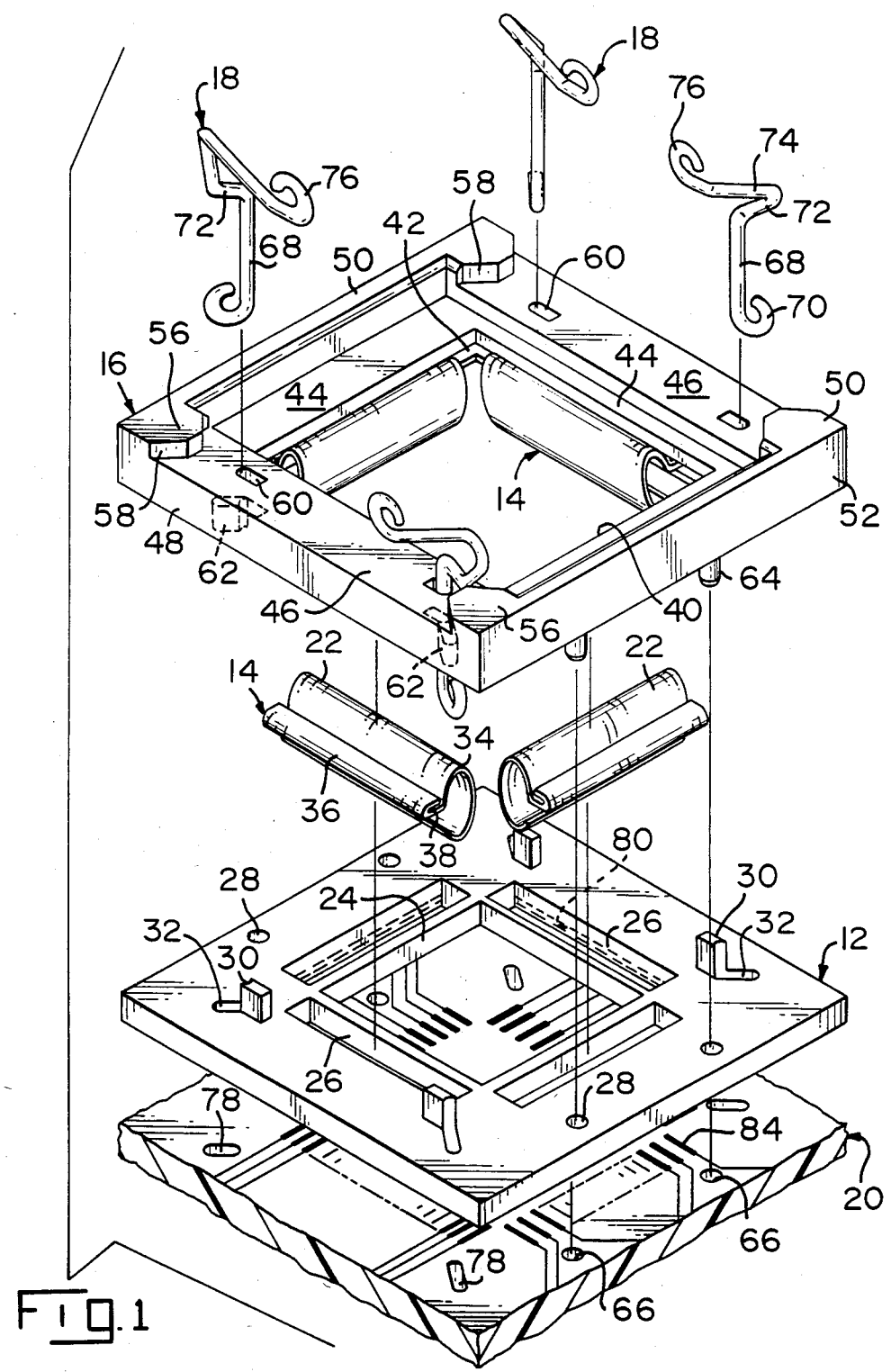
FIG. 1 is an exploded, isometric view of the connector of the present invention.

With reference to FIG. 1, the several components of connector 10 of the present invention include, from bottom to top, lower frame 12, contact members 14, upper frame 16 and clamps 18. The connector is adapted for use with a printed circuit board such as board 20 shown below the lower frame.

Both frames are preferably molded from an insulating material such as glass-filled nylon. The contact members may be a polymeric film with spaced apart flat or round conductors, indicated by reference numeral 22, on one side. Clamps 18 are formed from a strong material such as stainless steel.

An enlarged centrally located four-sided opening 24 extends through lower frame 12. Elongated, narrow passages 26, located adjacent each side of opening 24, extend through the frame also. As the lines indicate, contact members 14 are received in these passages.

Locating pin holes 28 are provided in the lower frame; in the embodiment shown, two such holes are located adjacent each of two opposing sides of the frame.

Four upwardly projecting narrow blocks 30 are positioned about the upper surface of frame 12. Four clamp receiving slots 32, extending through the frame, are located immediately next to the blocks and are at an oblique angle relative to the sides of the frame. The slots are elongated with one end being arcuately shaped.

As noted above, contact members 14 may be a polymeric film 34 with flat conductors 22 spaced along the length thereof and extending from side to side. The members are formed into a general C-shape with one side 36 projecting outwardly and the free edge bent back over to form a double thickness. This fold 38 is such that the conductors 22 are on the inside.

The contact member C-shape must maintain the described shapes. Accordingly, either the film or conductors or both must be of a material to keep a set. With the film being a polymeric, the conductors can be a thin copper alloy. Other combinations are available.

A four-sided central opening 40 extends through upper frame 16. Recesses 42 extend laterally back into the side walls defining the opening. These recesses run along the length of each side wall and may intersect adjacent recesses.

Ledges 44 extend around the central opening to provide a seat for the electronic package, hereinafter referred to as substrate, shown for example in FIG. 2.

The frame has a first upwardly facing surface 46 on two opposing sides 48 and a higher second upwardly facing surface 50 on the other two opposing sides 52.

The second surface 50 includes projections 56 at each end which intrude onto the first surface 46 and have angled sides 58 (angled relative to the sides of the frame). Four narrow slots 60, located on surface 46, extend through the frame to open out on the underside. One end of the slots is arcuate-shaped. Narrow blocks 62 are positioned at the arcuate-shaped end of the slots and extend away therefrom at an oblique angle. These blocks are on the underside of the frame and extend downwardly.

The slots and blocks associated with the upper frame are in a staggered relation to the slots and blocks of base frame 12: when the two frames are placed together the blocks on one frame are conformably received in the slots of the other frame. The blocks, however, are shorter in length than the slots and, consequently, a passage through each registered pair of slots is provided.

Two spaced apart pegs 64 depend from the underside of sides 52. These alignment pegs pass through holes 28 in lower frame 12 and into holes 66 in circuit board 20.

Clamps 18 are formed from a suitable, generally rigid material such as plated carbon steel. Each clamp includes a straight section 68 and a looped-about lower end 70. The upper portion of each clamp includes a bearing section 72 which is horizontal relative to or at right angles to the vertical section 68, a curving section 74 that loops back over section 72, and at the free end a looped section 76. This latter section provides a finger grip for rotating the clamp about the vertical axis extending through straight section 68.

Circuit board 20 also has four elongated slots 78, obliquely positioned with respect to the sides, and extending through the board. These slots are in registration with slots 32 in lower frame 12.

Another embodiment of the connector would be one with recesses in the outer wall defining passages 26. Such a recess is indicated by dashed lines and reference numeral 80. The recesses would receive a fold (not shown) on the lower free end of contact members 14 in the same manner that fold 38 is received in recesses 42 in frame 16. The contact members would be symmetrical and would not require orientation.

Assembling connector 10 requires threading clamps 18 through slots 60 in the upper frame and, if the second embodiment is being used, placing folds 38 on one end of the contact members into recesses 80 in the lower frame with the folds on the other end extending upwardly.

The two frames are brought together with the lower ends 70 of the clamps passing through slots 32 (the clamps need to be properly positioned). Concurrently, blocks 30 (on frame 12) and 62 (on frame 16) enter slots 60 (on frame 16) and 32 (on frame 12) respectively. As these blocks enter their respective slots, the slots' space is reduced to a passage (indicated by dashed lines and reference numeral 82 in FIGS. 5 and 6) which is only very slightly larger in diameter than the diameter of section 68 on the clamps.

Also concurrently, alignment pegs 64 pass through holes 28 in lower frame 12.

As the two blocks approach each other, the upper folds 38 are tucked into recesses 42 in the main frame.

Preferably, the fit between the blocks 30, 62, slots 32, 60, pegs 64 and holes 28 are tight enough to hold the assembly together. However, conventional fastening devices (not shown) may be employed or, as an alternative, a more permanent relation may be obtained by using an adhesive or the like. One advantage of an assembly, i.e., connector 10, that can be easily disassembled is ready replacement of contact members 14.

Connector 10 is mounted on circuit board 20 by the lower ends 70 of clamps 18 passing through slots 78 and pegs 64 entering holes 66. The pegs and associated holes provide a registration between circuits 84 on the board and conductors 22 on the contact members. Other polarizing means may be employed if desired. The connector may be further secured to the board by conventional fastening means.

Figure 2:
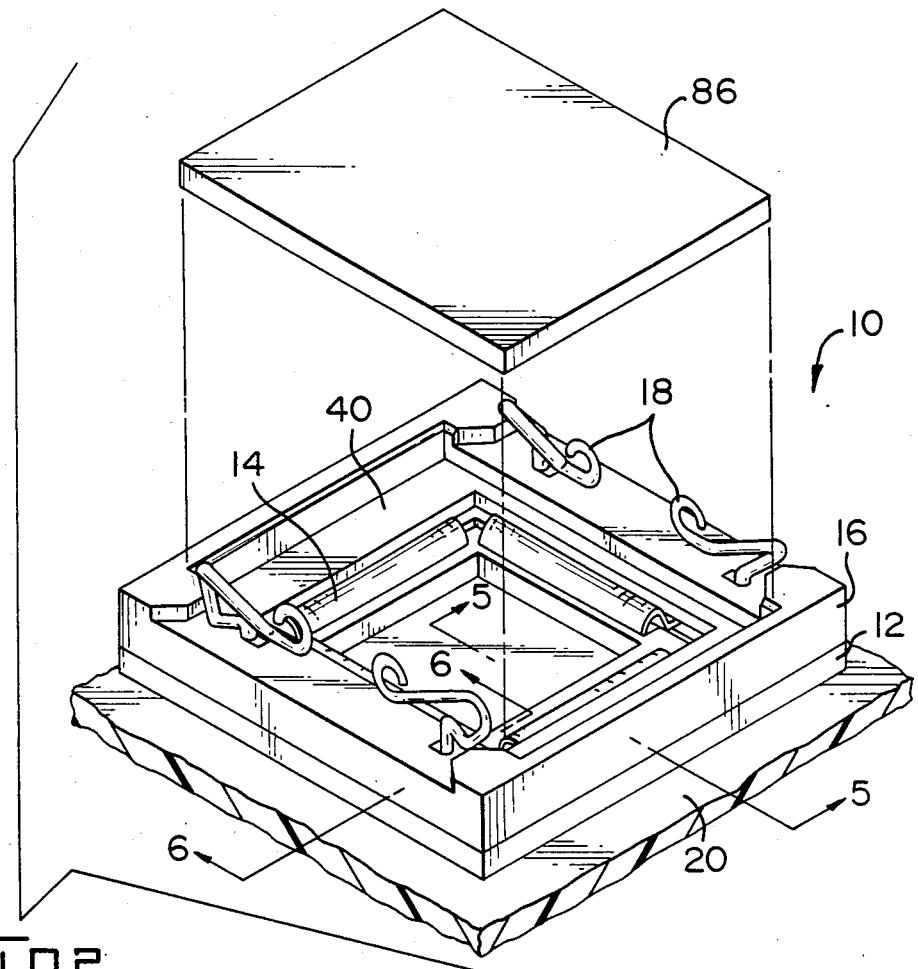
FIGS. 2 and 2A are views of the connector of FIG. 1 assembled and mounted on a circuit board.
Figure 2A:
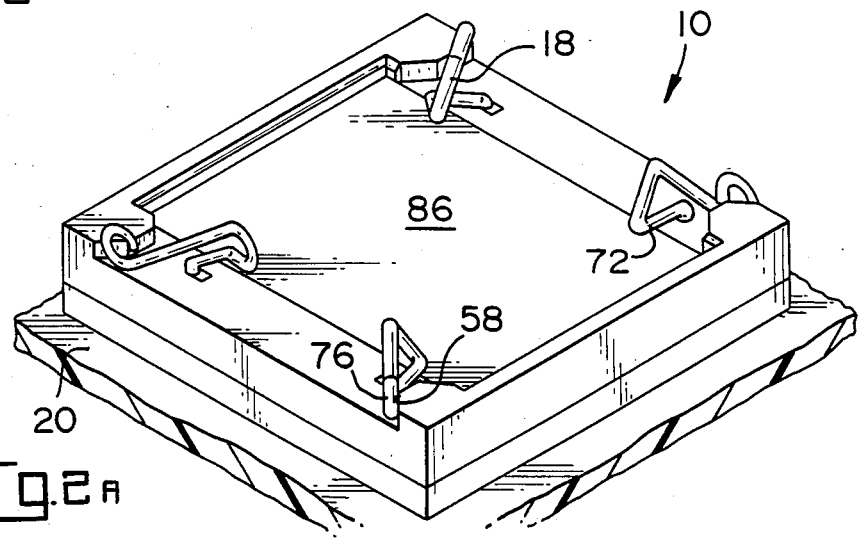

FIGS. 2 and 2A are isometric views of connector 10 mounted on circuit board 20. In FIG. 2, substrate 86, e.g., a leadless chip carrier, is shown above connector 10. Clamps 18 are turned so that access to opening 40 is unimpeded.

Substrate 86 is shown placed in opening 40 in the connector in FIG. 2A. Further, the drawing shows clamps 18 having been rotated about the longitudinal (vertical) axis to bring the horizontal bearing section 72 over the substrate. The substrate, biased upwardly by the contact members, is pushed down against them by the clamps. Thus the conductors are placed in compression between the substrate and circuits 84 on board 20.

Figure 3:
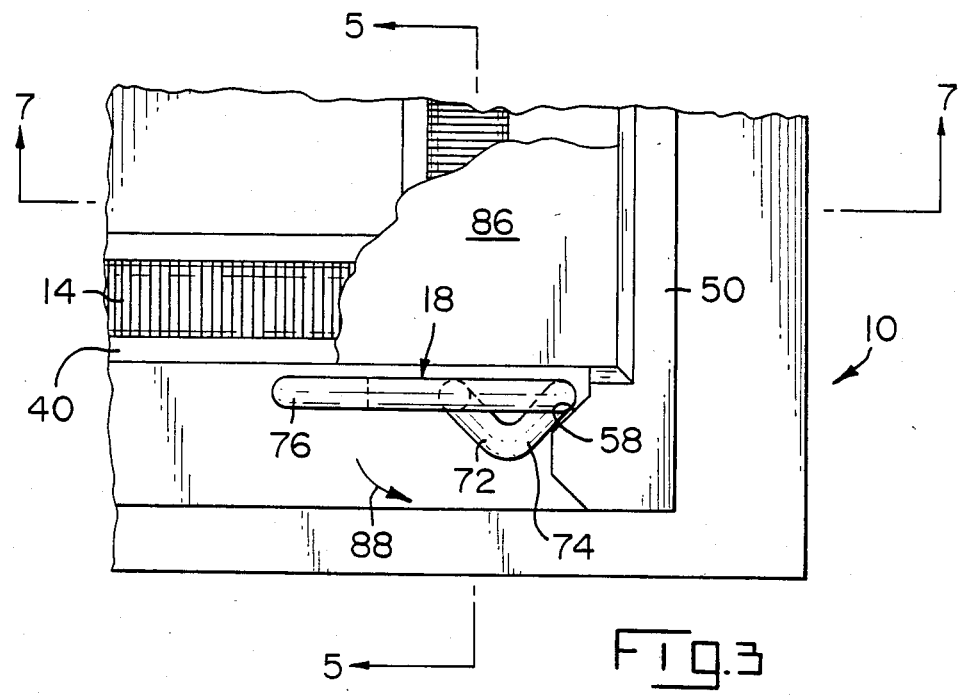
FIGS. 3 and 4 are top plan views and FIGS. 5 and 6 are side sectional views illustrating the clamping device on the connector of the present invention.

FIGS. 3 to 6 more fully illustrate the aforementioned clamping action. In FIG. 3, clamp 18 is in an open position. The finger gripping loop section 76 is in an exposed location for ready gripping. The curving section 74 is against angled wall 58. This prevents the gripping section from rotating over opening 40.

Figure 4:
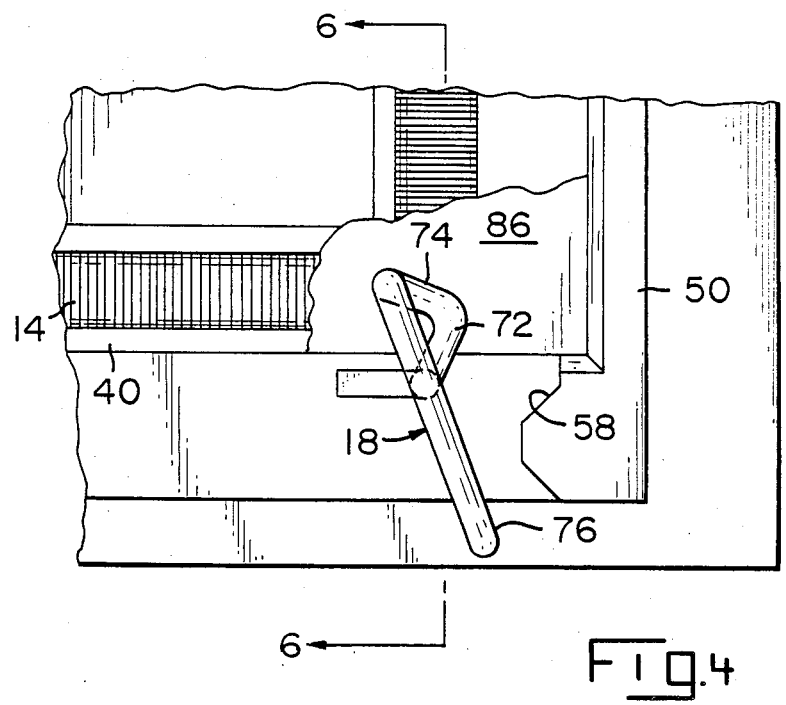

Clamp 18 has been rotated in FIG. 4 in the direction indicated by arrow 88 in FIG. 3. This rotation brings bearing surface 72 in against substrate 86 thereby clamping it in connector 10.

Figure 5:
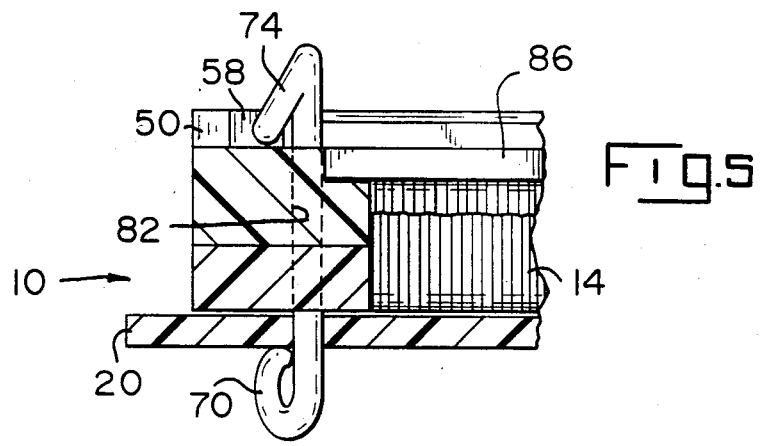
Figure 6:
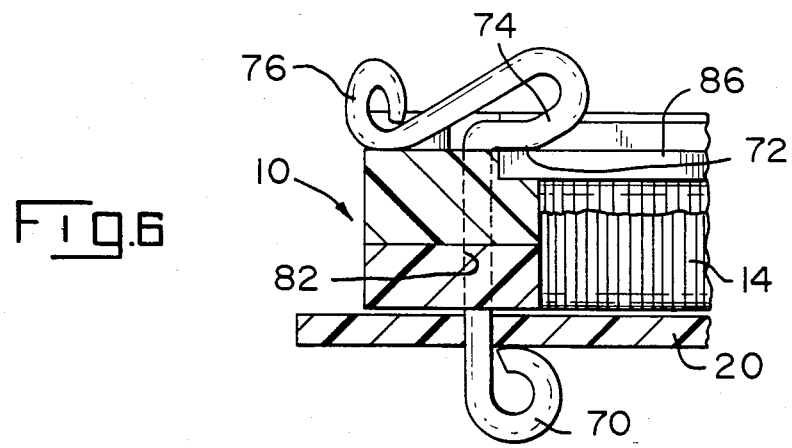

FIG. 5, taken along line 5—5 in FIG. 3, shows section 74 abutting an angled wall 58. FIG. 6, taken along line 6—6 in FIG. 4, shows the clamp rotated with section 72 bearing against substrate 86. Preferably the gripping section 76 abuts an angled wall 58 as shown in FIG. 2A.

Figure 7:
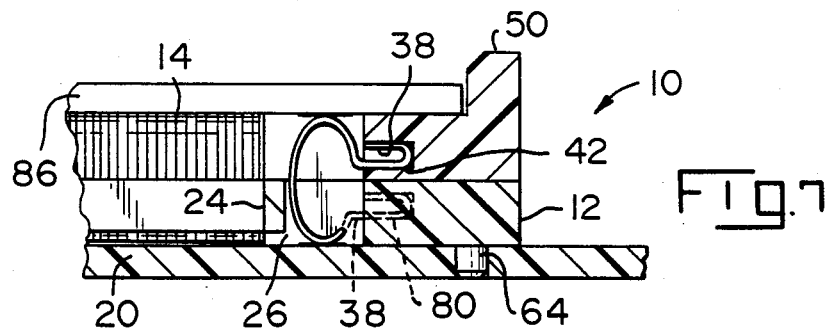
FIG. 7 is a side sectional view illustrating the assembled connector with a substrate positioned therein.

FIG. 7 is a sectional view showing the contact member between the substrate and board. Additionally, the drawing shows in dashed lines the modification whcih provides the second embodiment.

The present invention has been disclosed using leadless chip carrier substrates as one example of the utility of the connector. The connector clamps can be used with other types of connectors, e.g., the connectors disclosed in U.S. Pat. Nos. 4,341,433 and 4,427,249. Further, the connector may be modified to accept any desired electronic package.

The illustrated embodiments employ four clamps 18. Two clamps may well be sufficient in some applications.

I claim:

1. An electrical connector for electrically interconnecting a chip carrier to circuits on a circuit board, comprising:
   a. a lower frame having slots located near the corners and extending therethrough, and passage means through which conductive means may extend;
   b. an upper frame having a central opening, seats around the opening for receiving a chip carrier, a first surface displaced vertically upwardly relative to the seats, and four slots extending through the upper frame and opening out onto the first surface, and means to receive and retain conductive means, said upper frame adapted to be placed on the lower frame with the slots of both being in alignment;
   c. conductive means extending through the lower frame and received in the upper frame, said conductive means adapted to interconnect circuits on a chip carrier which may be positioned in the upper frame to circuits on a board on which the frames may be positioned; and
   d. elongated clamps having a straight section extending through the aligned slots in the joined frames and through aligned slots in a circuit board on which the frames may be positioned, and further having looped lower ends extending below the circuit board, and upper ends which include a bearing section which extends laterally from and at a right angle to the straight section, said clamps being rotatable so that a chip carrier in the upper frame and the joined frames are biased against the conductive means and the circuit board respectively by reason of the looped lower ends bearing against the under side of the circuit board, and the bearing sections bearing against the chip carrier.

2. The electrical connector of claim 1 further including cooperating means on each frame to reduce the length of the slots in the other frame subsequent to the positioning of the clamps therethrough and upon joining the frames.

3. The electrical connector of claim 2 further including a central opening in the lower frame.

4. The electrical connector of claim 1 further including stop means on the upper frame against which the upper ends abut to thereby limit the rotational travel of the clamps.

5. The electrical connector of claim 2 wherein the upper end further includes a curving section attached to and curving back over bearing section and a looped section at the free end of the curving section.

6. Clamps for biasing a chip carrier against conductive means in a connector of the type having slots therethrough and for removably securing the connector to a circuit board of the type having slot in alignment with the slots extending through the connector, said clamps comprising:

a. elongated straight sections rotatably positionable in slots in a connector and in slots in a circuit board on which the connector may be located;

b. lower ends attached to the straight sections and with the ends being looped back on themselves, said looped lower ends being adapted to removably bear against the under side of the circuit board;

c. upper ends attached to the straight sections and including bearing sections extending away from the straight sections at a right angle relative thereto, and curving sections attached to and curving back over the bearing sections, said bearing sections being adapted to removably bear against a chip carrier which may be positioned in the connector, said chip carrier being thereby biased against conductive means in the connector and the connector being biased against the circuit board by the looped lower ends and bearing sections cooperating to place said chip carrier, connector and circuit board in compression therebetween.

7. An electrical connector for connecting conductive members of an electronic component to conductive paths on a circuit member, comprising:

a. first and second dielectric frames having aligned apertures;

b. seat means on said first frame for receiving the electronic component;

c. conductive means mounted on at least one of said first and second frames so as to extend between the conductive members on the electronic component and the conductive paths on the circuit member thereby electrically connecting the conductive members with the conductive paths;

d. clamp means having first sections, second sections and third sections, said first sections extending through the aligned apertures in said frames so as to be movable relative thereto, said second sections extending substantially normal with respect to said first sections and being movable so to extend over the seat means of the first frame and into engagement with the electronic component thereby clamping the electronic component onto said seat means and the conductive members into engagement with the conductive means, said third sections extending outwardly from said first sections and adapted to extend through slots in the circuit member and engage a bottom surface of the circuit member when moved in engagement therewith thereby clamping the circuit member to the second frame and the conductive paths into electrical engagement with the conductive means.

8. An electrical connector for electrically interconnecting an electronic package to circuits on a circuit board or the like, comprising:

a. a lower frame having a plurality of slots extending therethrough;

b. an upper frame having an electronic package receiving area thereon and a plurality of slots extending therethrough, said upper frame adapted to be placed on the lower frame with the slots of both being in alignment;

c. conductive means mounted on at least one of said frames and extending between and interconnecting circuits an electronic package which may be mounted on the receiving area and circuits on a circuit board or the like on which the frames may be positioned;

d. a plurality of clamps, each having a straight section extending through the aligned slots in the joined frames and through slots in the circuit board or the like on which the frames may be positioned, a lower end located below the circuit board or the like and extending substantially normal to the straight section and an upper end extending substantially normal to the straight section, said clamps being rotatable so that the electronic package on the upper frame and the joined frames are biased against the conductive means and the circuit board or the like respectively by reason of the lower ends bearing against the under side of the circuit board or the like and the upper ends bearing against the electronic package.

9. The electrical connector of claim 8 further including cooperating means on each frame to reduce the length of the slots in the other frame subsequent to the positioning of the clamps therethrough and upon joining the frames together.

10. The electrical connector of claim 9 wherein the cooperating means include blocks on an underside of the upper frame and extending downwardly therefrom and blocks on an upper surface of the lower frame and extending upwardly therefrom, said blocks being positioned to conformably enter the slots on the other frame so as to reduce the length thereof.

11. The electrical connector of claim 8 wherein central openings are provided in both the upper and lower frames and the electronic package receiving area includes upwardly facing ledges extending around the central opening in the upper frame.

12. The electrical connector of claim 8 wherein the upper ends of the clamps include a bearing section adapted to bear against the electronic package and further a curving section attached to and curving back over the bearing section.

13. The electrical connector of claim 12 further including stop means on the upper frame against which the curving sections abut to thereby limit the rotational travel of the clamps.

14. The electrical connector of claim 13 wherein the lower ends of the clamps are looped back on themselves.

* * * * *